United States Patent [19]

Hoenig

[11] Patent Number: 4,591,787
[45] Date of Patent: May 27, 1986

[54] MULTI-CHANNEL DEVICE WITH SQUIDS AND SUPERCONDUCTING GRADIOMETERS FOR THE MEASUREMENT OF WEAK MAGNETIC FIELDS PRODUCED BY VARIOUS FIELD SOURCES

[75] Inventor: Eckhardt Hoenig, Erlangen, Fed. Rep. of Germany

[73] Assignee: Siemens Aktiengesellschaft, Berlin and Munich, Fed. Rep. of Germany

[21] Appl. No.: 562,494

[22] Filed: Dec. 16, 1983

[30] Foreign Application Priority Data

Dec. 22, 1982 [DE] Fed. Rep. of Germany ....... 3247585

[51] Int. Cl.[4] ............................................. G01R 33/02
[52] U.S. Cl. .................................. 324/248; 324/260; 336/DIG. 1; 307/306; 357/5
[58] Field of Search ............... 324/248, 249, 244, 245, 324/252, 260; 336/200, 199, 205, 208, DIG. 1; 357/5; 307/306

[56] References Cited

FOREIGN PATENT DOCUMENTS 1098226 1/1954 France ................................. 336/200

OTHER PUBLICATIONS

Ketchen et al., "Superconducting Thin-Film Gradiometer", J. Appl. Phys., vol. 49, No. 7, Jul. 1978, pp. 4111–4116.
Ehnholm et al., "Thin Film SQUID's for Magnetic Field Measurements", Jap. J. Appl. Phys., vol. 16, 1977, pp. 261–263.
Barbanera et al., "A SQUID Device for AC Current Measurements Down to $10^{-14}$A", J. Appl. Phys., vol. 49, No. 2, Feb., 78, pp. 905–909.
"SQUIDS and Their Applications in the Measurement of Weak Magnetic Fields" by Swithenby (J. Phy. E: Sci. Instrum., vol. 13, 1980, at pp. 801 to 813).
"Biomagnetism-Proceedings, Third International Workshop on Biomagnetism", Berlin 1980, Berlin/New York 1981 at pp. 3 to 31.
"Biomagnetism" by Williamson and Kaufman (Journal of Magnetism and Magnetic Materials, vol. 22, 1981 at pp. 129 to 201).
"A New Multi-Element rf SQUID System and its Application to the Magnetic Vector Gradiometer" by Shiraw et al., (Cryogenics, Dec. 1981, pp. 707 to 710).
"Advances in SQUID Magnetometers" by Clarke (IEEE Transactions on Electron Devices, vol. ED-27, No. 10, Oct. 1980, pp. 1896 to 1908).

Primary Examiner—Gerard R. Strecker
Assistant Examiner—Warren S. Edmonds
Attorney, Agent, or Firm—John Francis Moran

[57] ABSTRACT

A multi-channel device for the measurement of variable magnetic fields produced by various field sources, with field strengths of less than $10^{-10}$T, having in each channel a superconducting quantum interference device (SQUID), a gradiometer consisting of superconducting coils of predetermined dimensions, and superconducting connecting elements between the quantum interference device and the gradiometer. In addition, electronic equipment for the evaluation, processing and presentation of the information obtained at the quantum interference devices is provided. To increase the sensitivity of the measurement device by taking into account the distance between the field source and the gradiometer coil, the dimensions (diameter d) of the individual gradiometer coils ($17_j$, $19_j$) are adjusted, according to the invention, to the distance to the closest magnetic field source and means are provided for combining the signals of individual predetermined gradiometer coils in each case to one signal of a corresponding group ($D_1$ to $D_4$; $K_1$ to $K_4$) of gradiometer coils, depending on the distance of the magnetic field source to be detected in each case.

9 Claims, 2 Drawing Figures

MULTI-CHANNEL DEVICE WITH SQUIDS AND SUPERCONDUCTING GRADIOMETERS FOR THE MEASUREMENT OF WEAK MAGNETIC FIELDS PRODUCED BY VARIOUS FIELD SOURCES

BACKGROUND OF THE INVENTION

The invention concerns a multi-channel device for the measurement of variable magnetic fields produced by various field sources, having field strengths of less than $10^{-10}$T, and in particular of less than $10^{-12}$T. The measuring device includes in each channel a superconducting quantum interference device, a gradiometer consisting of superconducting coils with predetermined dimensions and superconducting connecting elements between the quantum interference device and the gradiometer. In addition, the device includes electronic equipment for the evaluation, processing and presentation of the information obtained at the quantum interference devices.

The use of superconducting quantum interference elements, which are generally known as "SQUIDs" (abbreviation for "Superconducting Quantum Interference Devices"), for measuring very weak magnetic fields is generally known (see for example, "J. Phy. E:Sci. Instrum.," Vol. 13, 1980, pages 801 to 813; and "IEEE Transactions on Electron Devices," Vol. ED-27, No. 10, October 1980, pages 1896 to 1908). The preferred field of application for these devices is medical engineering, and in particular for magnetocardiography and magnetoencephalography. The magnetic cardiac or brain waves that occur in these sectors have field strengths that are located in the range of 50 pT to 0.1 pT ("Biomagnetism-Proceedings, Third International Workshop on Biomagnetism, Berlin 1980," Berlin/New York 1981, pages 3 to 31).

A device for the measurement of magnetic fields of this kind includes the following principal components:
1. A SQUID acting as a current sensor;
2. A flux transformer with a coil arrangement acting as a field-to-current transducer for sensing the field;
3. Electronic devices for collecting and processing signals and for output;
4. Screening for the geomagnetic field and external interference fields; and
5. A cryogenic system for the superconducting components.

Measuring devices of this type are generally know (see for example, S.H.E. Corporation, Dan Diego, USA/S.H.E. GmbH, D-5100 Aachen).

In corresponding measurement devices with a one-channel design, the magnetic field to be investigated is coupled inductively through a coil arrangement made of superconducting wire, into a circuit consisting of radiofrequency (RF) SQUID with a Josephson contact. Gradiometers of the first or higher orders are constructed by combining one sensor coil with one or more compensation coils. With gradiometers of this type, it is possible, with the right method of manual adjustment, to suppress almost entirely the three components of a homogenous magnetic field in the vicinity of the coils or of the portion of such a field with homogenous gradients. Additionally, the biomagnetic near field which is still strongly heterogenous in the vicinity of the gradiometers can be selectively obtained. The RF SQUID is also inductively coupled to a tank circuit, whose high-frequency voltage is modulated in phase or amplitude by the input signal. In general, the operating poing of the RF SQUID is maintained by negative feedback by means of an additional compensation coil, and the compensation current is used as a signal to be evaluated electronically.

using this familiar one-channel measuring device as a starting point, multi-channel devices have also been suggested. In this case, each channel has, in addition to a SQUID, a superconducting gradiometer and connecting elements between the SQUID and the gradiometer with a coupling transformer and connecting lines.

With the gradiometer coils it is possible to monitor the flux of the field vector of a field source that is to be observed, such as, for example, the "magnetic heart vector" ("Journal of Magnetism and Magnetic Materials," Vol. 22, 1982, No. 2, pages 129 to 201). This field vector is, however, dependent on distance. By adjusting the dimensions of the gradiometer coils with regard to the distance from the field source in each case, it is possible to optimize the sensitivity: that is, for a predetermined distance between a field source and a gradiometer coil, certain optimal dimensions for that gradiometer coil exist.

The object to be investigated in magnetic cardiac diagnostic, has a surface of about 100 cm$^2$, and is located not at a single depth, but at depths ranging from 2 to 10 cm below the thoracic wall; furthermore, its location and dimensions are subject to periodic fluctuation. Accordingly, the practical problem arises from the fact that a gradiometer coil at the upper surface of the thorax which has a predetermined dimension, for example, a fixed diameter of 3 cm, can generally pick up only the near field of a small area of the front wall of the heart. It is unable to pick up the far field of the areas lying deeper within the body. Similarly, with the gradiometer coils that are used for magnetoencephalographic investigations, which have a diameter of about 2 cm and are optimally suited for measurements of field sources in the cerebral cortex, it is impossible to make measurements of sources in the brain stem. This is because for measurements of this kind, the optimum diameter of the gradiometer coil would be about 10 cm. Therefore, any adjustment of the coil dimensions to the specific distance to the field source to be investigated is virtually impossible in these conventional devices.

SUMMARY OF THE INVENTION

The object of the present invention is to provide an improved measuring device for measuring variable magnetic fields in which it is possible to increase the device's sensitivity by taking into account the distance between the field source and the gradiometer coil.

This is accomplished, according to the invention in a multi-channel device by adjusting the dimensions of the individual gradiometer coils to the smallest distance within a predetermined range of distances to the magnetic field source. Then the signals of individual predetermined gradiometer coils each in a channel are combined into a common signal of a corresponding group of gradiometer coils, as a function of distance of the magnetic field source within the predetermined range to be detected in each case.

The adjustment of the dimensions of the gradiometer coils in this case is accomplished by a known method so that the local resolution is optimized for the given distance between the gradiometer coil used for detecting and the closest source generating a magnetic field (cf., for example, the abovementioned publication from the "Journal of Magnetism and Magnetic Materials"). Depending in each case on whether near or remote sources are to be recorded, the signals from individual gradiometer coils or combined signals from a number of gradiometer coils are collected for evaluation. The advantages of the measuring device embodiment in accordance with the invention are that the effective diameter of a gradiometer coil can be optimally adjusted to the measurement distance.

For combining signals from individual gradiometer coils, it is particularly advantageous to interconnect the corresponding channels in the electronic equipment for the evaluation and processing of the information obtained at the quantum interference devices.

In other preferred embodiments of the measurement device there are included a common rigid substrate for the quantum interference devices, the associated gradiometer coils and the superconducting connecting elements; the gradiometer coils are arranged as an array of detection coils and as an array of compensation coils on the common substrate; the gradiometer coils and the superconducting connecting elements are deposited on the substrate as thin-film structures; and the quantum interference devices are arranged on a common carrying chip, and this chip is rigidly mounted to the common substrate.

Other features and advantages of the invention will be apparent from the following description of the preferred embodiment, and from the claims.

For a full understanding of the present invention, reference should now be made to the following detailed description of the invention and to the accompanying drawings.

BRIEF DESCRIPTION OF THE DRAWINGS

For a further explanation of the invention reference should be made to the drawings, which are described as follows.

DETAILED DESCRIPTION

Figure 1:
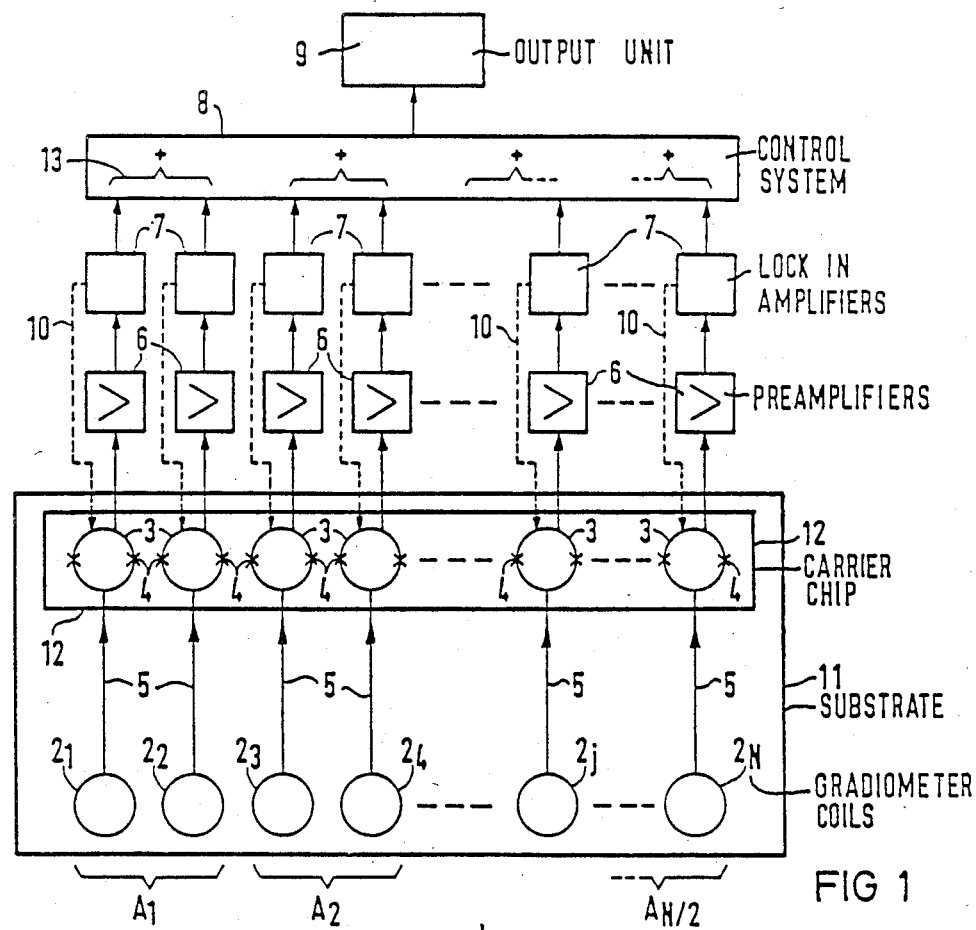
FIG. 1 is a circuit diagram of a measurement device according to the invention.

According to the circuit diagram shown in FIG. 1, a predetermined number N of parallel measurement channels has been provided for the measurement device. In this case each channel contains a superconducting gradiometer $2_j$ (with $1 \leq j \leq N$), a quantum interference device 3, which is preferably a direct-current device (DE-SQUID) with two Josephson contacts 4, a superconducting connecting element 5 to connect gradiometer $2_j$ with SQUID 3, as well as a preamplifier 6 that may be cooled also and a "lock-in" amplifier 7 that may be at room temperature.

The N unprocessed signals that are received from lock-in amplifiers 7 are then conducted to a joint electronic data-processing and control system 8 for further processing and to an output unit 9 for display. An optional feedback in the channels to the individual SQUIDs with the signals received from lock-in amplifiers 7 is indicated by dotted lines 10. The directions for the signal transmission are shown in FIG. 1 by means of arrows along the corresponding lines.

FIG. 1 further shows gradiometers $2_j$, SQUIDs 3 and connecting elements 5 that are required between them, mounted on a common, rigid substrate. This substrate is indicated in FIG. 1 by rectangle 11. In a similar manner, it is also shown that SQUIDs 3, with their associated transformers, are located on carrying chip 12. Carrying chip 12 is located firmly on substrate 11. Gradiometers coils $2_j$, together with leads 5 that run between them and the DC SQUIDs that are located on carrying chip 12, can be advantageously deposited on substrate 11 as thin-film structures by means of planar lithography, while SQUIDs 3 on chip 12 can be constructed according to integrated circuit (IC) technology.

In order to be able to adjust the diameter of the gradiometer coils to the depth of the source, that is, the distance between the coil in question and a field source that is to be detected, in order to optimize the local resolution of the measurement device, the signals generated at the individual gradiometer coils $2_j$ can be combined in a predetermined manner. Correspondingly, according to the embodiment shown in the figures, it is possible to combine the signals of the gradiometer coil arrays $A_1$ to $A_{N/2}$, where N is assumed to be an even number, that are formed by the gradiometer coils $2_1$ and $2_2$; $2_3$ and $2_4$; etc. The combination of the signals preferably takes place within electronic system 8, which is common to all the groups, by means of appropriate connecting circuits, which are shown by means of brackets 13. In addition to the interconnection of the signals from individual channels by means of a combination of the analog signals at the outputs of lock-in amplifiers 7, as shown in this embodiment, other interconnections can, of course, also be used to adjust to the respective depth of the source. Thus, digital signals that have already been converted and assigned can also be combined.

The simplest arrangement of field sensors is an array of gradiometers of zero order, that is, a level arrangement of adjacent, flat cylindrical coils made of superconducting wire. Measurements with an array of this kind, without additional compensation from external fields requires relatively expensive screening. However, a gradiometer array of this kind can be easily manufactured. Gradiometers of the first order make lesser demands with regard to screening.

Figure 2:
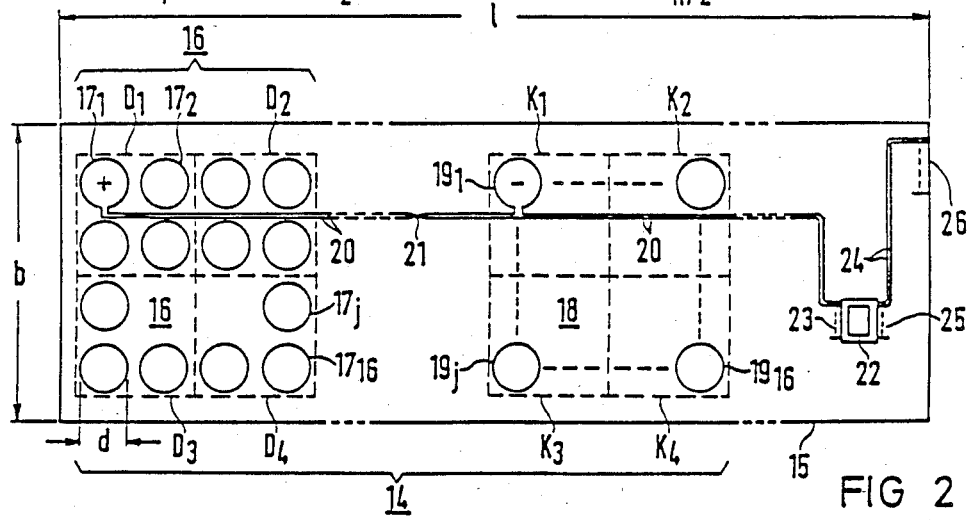
FIG. 2 shows schematically an illustrative substrate arrangement for the device indicated in FIG. 1 including SQUIDS and gradiometers.

Further details of an embodiment of the invention having an appropriate gradiometer arrangement on a common substrate are shown in FIG. 2.

Gradiometer series 14 which is also called a gradiometer array, is designed in planar form so that it is deposited on a planar substrate; for example, silicon plate 15 which is approximately 10 mm thick, 12 cm wide (b) and 30 cm long (l). The gradiometer array includes an array 16 of detection coils $17_j$, an array 18 with a corresponding number of compensation coils $19_j$ and appropriate leads 20, where $1 \leq j \leq N$. According to the embodiment shown, array 16 has been chosen for the number of channels N. Therefore, each of arrays 16 and 18 consists, for example, of $4 \times 4$ individual superconducting flat coils, with one winding each. The direction of the windings on detection coils 17 and compensation coils 19 is shown by a "+" and "−" sign. Since the direction of the winding on detection coils 17 is opposite to the direction of the winding on compensation coils $19_j$, a crossover point 21 must be constructed between the two arrays, 16 and 18, of flat coils in leads 20 that run between them. In addition to the arrangement of detection coils $17_j$ in relation to compensation coils $19_j$ shown in FIG. 2, another positioning of the individual coils is possible. Thus for example, with external compensation, the detection coils can be enclosed by a ring of individual compensation coils. The array of flat compensation coils 18 can also advantageously be replaced by a smaller array of coils with a correspondingly higher number of windings. This can be accomplished, for example, by means of a lithograph process with the aid of an insulating intermediate layer. Also located on plate-shaped substrate 15 is chip 22 with a number of DC SQUIDs corresponding to the number N of gradiometers, including superconducting coupling transformers and modulation coils with terminals. At terminal points 23, the respective connecting lines 20, used to conduct the field signals registered in the gradiometer coils, are connected to these coupling transformers by superconducting leads. The signals picked up at the individual SQUIDs are then conducted over non-superconducting input/output lines 24, which are connected at appropriate terminal points 25 with the DC SQUID chip 22, to multiple connector 26, to which, in turn, the amplifiers of the respective channels are connected.

According to the invention, the dimensions of each of the flat coils $17_j$ or $19_j$ which, if round in shape, have a diameter d, are to be adjusted to the distance of the closest magnetic field source that is to be detected, with respect to an optimal local resolution. Thus, for example, for magnetoencephalography, a diameter d of about 2 cm, which is optimal for taking measurements of sources in the cerebral cortex is generally chosen for the detection coils $17_j$. In order to also permit an adaptation to magnetic field sources that lie deeper within the body, the coil relationships are set up by means of a suitable combination of the signals from individual gradiometer coils, which correspond closely to effective coil dimensions that are optimal for the greater distances between the magnetic field source and the coil. Thus for example, four of the detection coils $17_j$ and the associated compensation coils $19_j$ can form a group of coils indicated by broken lines in each case. In the Fig., the corresponding groups of detection coils are designated by $D_1$ to $D_4$ and the associated groups of compensation coils by $K_1$ to $K_4$. The combination of the signals registered in these groups is then systematically accomplished with the aid of the connected electronic system (not shown in the Fig.).

In the case of the embodiment shown in FIG. 2, groups $D_1$ to $D_4$ and $K_1$ to $K_4$ are formed respectively from the detection coils $17_j$ and the compensation coils $19_j$ in such a manner that each of the coils $17_j$ and $19_j$ is assigned to only one single group. Particularly when it is a question of increasing the possibilities for adaptation to the geometrical position of the individual field sources, it is also possible to assign individual coils to a number of groups. Therefore, the groups indicated in the Fig. by means of broken lines then overlap in terms of the coils they have in common. This can also result in groups with a different number of coils.

Departing from the planar design of substrate 15 shown in FIG. 2, it is also possible to have substrates with a marked three-dimensional design, in order to permit the arrangement of the arrays of detection coils and compensation coils to be at separate parallel levels. In this matter, gradiometers of a higher order can be produced.

There has thus been shown and described a novel multi-channel device for the measurement of weak magnetic fields which fulfills all the objects and advantages sought. Many changes, modifications, variations and other uses and applications of the subject invention will, however, become apparent to those skilled in the art after considering this specification and the accompanying drawings which disclose preffered embodiments thereof. All such changes, modifications, variations and other uses and applications which do not depart from the spirit and scope of the invention are deemed to be covered by the invention which is limited only by the claims which follow.

I claim:

1. In a multi-channel device for the measurement of variable magnetic fields produced by various field sources located within a predetermined range of distances from the surface of a body, with field strengths of less than $10^{-10}$T, where the measuring device includes in each channel a superconducting quantum interference device (SQUID), a gradiometer comprising superconducting coils with predetermined dimensions and superconducting connecting elements between the quantum interference device and the gradiometer, and which is provided, in addition, with electronic equipment for the evaluation, processing and presentation of the information obtained at the quantum interference devices the improvement comprising, individual gradiometer coils ($2_j$; $17_j$; $19_j$) the dimensions of which being adjusted to provide the optimum sensitivity for the smallest distance within the predetermined range and means for combining the signals from a plurality of individual predetermined gradiometer coils into a signal from the corresponding one of groups ($D_1$ to $D_4$; $K_1$ to $K_4$) of gradiometer coils, the number of signals from the coils being combined increasing the response for a larger distance within the predetermined range wherein the larger distance essentially corresponds to the distance from the surface of the body to the respective magnetic field source to be detected.

2. The multi channel device of claim 1, wherein said device can measure variable magnetic fields with field strengths of less than $10^{-12}$T.

3. The measurement device of claim 1, wherein said combination of signals from individual gradiometer coils ($2_j$; $17_j$; $19_j$) are interconnected to corresponding channels in the electronic equipment for the evaluation and processing of the information obtained at the quantum interference devices.

4. The measurement device of claim 1, further comprising a common rigid substrate for said quantum interference devices, said associated gradiometer coils and said superconducting connecting elements.

5. The measurement device of claim 2, further comprising a common rigid substrate for said quantum inteference devices, said associated gradiometer coils and said superconducting connecting elements.

6. The measurement device of claim 3, further comprising a common rigid substrate for said quantum interference devices, said associated gradiometer coils and said superconducting connecting elements.

7. The measurement device of claim 4, wherein said gradiometer coils are arranged as an array of detection coils and as an array of compensation coils on said common substrate.

8. The measurement device of claim 4, wherein said gradiometer coils and said superconducting connecting elements are deposited on said substrate as thin-film structures.

9. The measurement device of claim 4, wherein said quantum interference devices are arranged on a common carrying chip, said chip being rigidly mounted on said substrate.

* * * * *